(12) United States Patent
Smith et al.

(10) Patent No.: US 7,456,812 B2
(45) Date of Patent: Nov. 25, 2008

(54) DISPLAY DRIVER CIRCUITS

(75) Inventors: Euan C. Smith, Cambridge (GB); Paul R. Routley, Cambridge (GB)

(73) Assignee: Cambridge Display Technology Limited, Cambridge (GB)

( * ) Notice: Subject to any disclaimer, the term of this patent is extended or adjusted under 35 U.S.C. 154(b) by 613 days.

(21) Appl. No.: 10/493,015

(22) PCT Filed: Oct. 23, 2002

(86) PCT No.: PCT/GB02/04781

§ 371 (c)(1),
(2), (4) Date: Aug. 23, 2004

(87) PCT Pub. No.: WO03/038798

PCT Pub. Date: May 8, 2003

(65) Prior Publication Data

US 2005/0007353 A1  Jan. 13, 2005

(30) Foreign Application Priority Data

Oct. 31, 2001  (GB) .................................. 0126122.1

(51) Int. Cl.
G09G 3/20 (2006.01)
G09G 3/30 (2006.01)
G09G 3/32 (2006.01)
G09G 5/00 (2006.01)
G06F 3/038 (2006.01)

(52) U.S. Cl. .............................. 345/82; 345/55; 345/76; 345/77; 345/81; 345/204; 345/207

(58) Field of Classification Search .................... 345/55, 345/76, 77, 81, 82, 204, 207
See application file for complete search history.

(56) References Cited

U.S. PATENT DOCUMENTS 4,539,507 A    9/1985    VanSlyke et al. ............ 313/504

(Continued)

FOREIGN PATENT DOCUMENTS

EP    717 446 A2    6/1996

(Continued)

OTHER PUBLICATIONS

International Search Report in PCT/GB02/04781 dated Apr. 22, 2003.

(Continued)

*Primary Examiner*—Sumati Lefkowitz
*Assistant Examiner*—Alexander S. Beck
(74) *Attorney, Agent, or Firm*—Marshall, Gerstein & Borun LLP

(57) ABSTRACT

Display driver circuitry for electro-optic displays, in particular active matrix displays using organic light emitting diodes. The circuitry includes a driver to drive an electro-optic element in accordance with a drive voltage, a photosensitive device optically coupled to the electro-optic display element to pass a current dependent upon illumination reaching the photosensitive device, a first control device coupled between the photosensitive device and a data line and responsive to a first control signal on a first control line to couple the photosensitive device to the data line, and a second control device coupled between the photosensitive device and the driver and responsive to a second control signal on a second control line to couple the photosensitive device to the driver. The circuit can be operated in a number of different modes and provides flexible control of an electro-display element such as an organic LED pixel.

24 Claims, 4 Drawing Sheets

U.S. PATENT DOCUMENTS

| | | | | |
|---|---|---|---|---|
| 5,204,661 | A * | 4/1993 | Hack et al. | 345/88 |
| 5,485,177 | A * | 1/1996 | Shannon et al. | 345/182 |
| 5,838,308 | A * | 11/1998 | Knapp et al. | 345/173 |
| 6,424,326 | B2 * | 7/2002 | Yamazaki et al. | 345/77 |
| 6,720,942 | B2 * | 4/2004 | Lee et al. | 345/82 |
| 2002/0047550 | A1 | 4/2002 | Tanada | 315/155 |

FOREIGN PATENT DOCUMENTS

| | | |
|---|---|---|
| EP | 717 446 A3 | 6/1996 |
| EP | 880 303 A1 | 11/1998 |
| EP | 923 067 A1 | 6/1999 |
| EP | 1 096 466 A1 | 5/2001 |
| EP | 1 117 085 A2 | 7/2001 |
| GB | 1210772 | 10/1970 |
| JP | 5-35207 | 2/1993 |
| JP | 2002-169511 | 6/2002 |
| WO | WO 90/13148 | 11/1990 |
| WO | WO 95/06400 | 3/1995 |
| WO | WO 99/42983 | 8/1999 |
| WO | WO 99/48160 | 9/1999 |
| WO | WO 99/54936 | 10/1999 |
| WO | WO 01/20591 A1 | 3/2001 |
| WO | WO 01/99191 A1 | 12/2001 |

OTHER PUBLICATIONS

International Preliminary Examination Report in PCT/GB02/04781 dated Sep. 3, 2003.

Search Report in GB 0126122.1 dated Oct. 21, 2003.

* cited by examiner

DISPLAY DRIVER CIRCUITS

This is the U.S. national phase of International Application No. PCT/GB02/04781 filed Oct. 23, 2002, the entire disclosure of which is incorporated herein by reference.

BACKGROUND OF THE INVENTION

1. Field of the Invention

This invention generally relates to display drivers for electro-optic displays, and in particular relates to circuitry for driving active matrix organic light emitting diode displays.

2. Description of Related Technology

Organic light emitting diodes (OLEDs) comprise a particularly advantageous form of electro-optic display. They are bright, colorful, fast-switching, provide a wide viewing angle and are easy and cheap to fabricate on a variety of substrates. Organic LEDs may be fabricated using either polymers or small molecules in a range of colors (or in multi-colored displays), depending upon the materials used. Examples of polymer-based organic LEDs are described in WO 90/13148, WO 95/06400 and WO 99/48160; examples of so called small molecule based devices are described in U.S. Pat. No. 4,539,507.

A basic structure 100 of a typical organic LED is shown in FIG. 1a. A glass or plastic substrate 102 supports a transparent anode layer 104 comprising, for example, indium tin oxide (ITO) on which is deposited a hole transport layer 106, an electroluminescent layer 108, and a cathode 110. The electro luminescence layer 108 may comprise, for example, a PPV (poly(p-phenylenevinylene)) and the hole transport layer 106, which helps match the hole energy levels of the anode layer 104 and electroluminescent layer 108, may comprise, for example, PEDOT:PSS (polystyrene-sulphonate-doped polyethylene-dioxythiophene). Cathode layer 110 typically comprises a low work function metal such as calcium and may include an additional layer immediately adjacent electroluminescent layer 108, such as a layer of aluminum, for improved electron energy level matching. Contact wires 114 and 116 to the anode the cathode respectively provide a connection to a power source 118. The same basic structure may also be employed for small molecule devices.

In the example shown in FIG. 1a light 120 is emitted through transparent anode 104 and substrate 102 and such devices are referred to as "bottom emitters". Devices which emit through the cathode may also be constructed, for example by keeping the thickness of cathode layer 110 less than around 50-100 nm so that the cathode is substantially transparent.

Organic LEDs may be deposited on a substrate in a matrix of pixels to form a single or multi-color pixellated display. A multicolored display may be constructed using groups of red, green, and blue emitting pixels. In such displays the individual elements are generally addressed by activating row (or column) lines to select the pixels, and rows (or columns) of pixels are written to, to create a display. It will be appreciated that with such an arrangement it is desirable to have a memory element associated with each pixel so that the data written to a pixel is retained whilst other pixels are addressed. Generally this is achieved by a storage capacitor which stores a voltage set on a gate of a driver transistor. Such devices are referred to as active matrix displays and examples of polymer and small-molecule active matrix display drivers can be found in WO 99/42983 and EP 0,717,446A respectively.

FIG. 1b shows such a typical OLED driver circuit 150. A circuit 150 is provided for each pixel of the display and ground 152, $V_{ss}$ 154, row select 164 and column data 166 busbars are provided interconnecting the pixels. Thus each pixel has a power and ground connection and each row of pixels has a common row select line 164 and each column of pixels has a common data line 166.

Each pixel has an organic LED 156 connected in series with a driver transistor 158 between ground and power lines 152 and 154. A gate connection 159 of driver transistor 158 is coupled to a storage capacitor 160 and a control transistor 162 couples gate 159 to column data line 166 under control of row select line 164. Transistor 162 is a field effect transistor (FET) switch which connects column data line 166 to gate 159 and capacitor 160 when row select line 164 is activated. Thus when switch 162 is on a voltage on column data line 166 can be stored on a capacitor 160. This voltage is retained on the capacitor for at least the frame refresh period because of the relatively high impedances of the gate connection to driver transistor 158 and of switch transistor 162 in its "off" state.

Driver transistor 158 is typically an FET transistor and passes a (drain-source) current which is dependent upon the transistor's gate voltage less a threshold voltage. Thus the voltage at gate node 159 controls the current through OLED 156 and hence the brightness of the OLED.

The standard voltage-controlled circuit of FIG. 1b suffers from a number of drawbacks. The main problems arise because the brightness of OLED 156 is dependent upon the characteristics of the OLED and of the transistor 158 which is driving it. In general, these vary across the area of a display and with time, temperature, and age. This makes it difficult to predict in practice how bright a pixel will appear when driven by a given voltage on column data line 166. In a color display the accuracy of color representations may also be affected.

Two circuits which partially address these problems are shown in FIGS. 2a and 2b. FIG. 2a shows a current-controlled pixel driver circuit 200 in which the current through an OLED 216 is set by setting a drain source current for OLED driver transistor 212 using a reference current sink 224 and memorizing the driver transistor gate voltage required for this drain-source current. Thus the brightness of OLED 216 is determined by the current, $I_{col}$, flowing into adjustable reference current sink 224, which is set as desired for the pixel being addressed. It will be appreciated that one current sink 224 is provided for each column data line 210 rather than for each pixel.

In more detail, power 202, 204, column data 210, and row select 206 lines are provided as described with reference to the voltage-controlled pixel driver of FIG. 1b. In addition an inverted row select line 208 is also provided, the inverted row select line being high when row select line 206 is low and vice versa. A driver transistor 212 has a storage capacitor 218 coupled to its gate connection to store a gate voltage for driving the transistor to pass a desired drain-source current. Drive transistor 212 and OLED 216 are connected in series between a power 202 and ground 204 lines and, in addition, a further switching transistor 214 is connected between drive transistor 212 and OLED 216, transistor 214 having a gate connection coupled to inverted row select line 208. Two further switching transistors 220, 222 are controlled by non-inverted row select line 206.

In the embodiment of the current-controlled pixel driver circuit 200 illustrated in FIG. 2a all the transistors are PMOS, which is preferable because of their greater stability and better resistance to hot electron effects. However NMOS transistors could also be used. This is also true of circuits according to the invention which are described below.

In the circuit of FIG. 2a the source connections of the transistors are towards GND and for present generation OLED devices $V_{ss}$ is typically around −6 volts. When the row is active the row select line 206 is thus driven at −20 volts and inverted row select line 208 is driven at 0 volts.

When row select is active transistors 220 and 222 are turned on and transistor 214 is turned off. Once the circuit has reached a steady state reference current $I_{col}$, into current sink 224 flows through transistor 222 and transistor 212 (the gate of 212 presenting a high impedance). Thus the drain-source current of transistor 212 is substantially equal to the reference current set by current sink 224 and the gate voltage required for this drain-source current is stored on capacitor 218. Then, when row select becomes inactive, transistors 220 and 222 are turned off and transistor 214 is turned on so that this same current now flows through transistor 212, transistor 214, and OLED 216. Thus the current through OLED is controlled to be substantially the same as that set by reference current sink 224.

Before this steady state is reached the voltage on capacitor 218 will generally be different from the required voltage and thus transistor 212 will not pass a drain source current equal to the current, $I_{col}$, set by reference sink 224. When such a mismatch exists a current equal to the difference between the reference current and the drain-source current of transistor 212 flows onto or off capacitor 218 through transistor 220 to thereby change the gate voltage of transistor 212. The gate voltage changes until the drain-source current of transistor 212 equals the reference current set by sink 224, when the mismatch is eliminated and no current flows through transistor 220.

The circuit of FIG. 2a solves some of the problems associated with the voltage-controlled circuit of FIG. 1b as the current through OLED 216 can be set irrespective of variations in the characteristics of pixel driver transistor 212. However the circuit of FIG. 2a is still prone to variations in the characteristic of OLED 216 between pixels, between active matrix display devices, and over time. A particular problem with OLEDs is a tendency for their light output to decrease over time, dependent upon the current with which they are driven (this may be related to the passage of electrons through the OLED). Such degradation is particularly apparent in a pixellated display where the relative brightness of nearby pixels can easily be compared. A further problem with the circuit of FIG. 2a arises because each of transistors 212, 214 and 222 must be sufficiently physically large to handle the current through OLED 216, which is equal to the $I_{col}$ reference current. Large transistors are generally undesirable and, depending upon the active matrix device structure, may also obscure or prevent the use of part of a pixel's area.

In an attempt to address these additional problems there have been a number of attempts to employ optical feedback to control the OLED current. These attempts are described in WO 01/20591, EP 0,923,067A, EP 1,096,466A, and JP 5-035,207 and all employ basically the same technique. FIG. 2b, which is taken from WO 01/20591, illustrates the technique, which is to connect a photodiode across the storage capacitor.

FIG. 2b shows a voltage-controlled pixel driver circuit 250 with optical feedback 252. The main components of the driver circuit 250 of FIG. 2b correspond to those of circuit 150 of FIG. 1b, that is, an OLED 254 in series with a driver transistor 256 having a storage capacitor 258 coupled to its gate connection. A switch transistor 260 is controlled by a row conductor 262 and, when switched on, allows a voltage on capacitor 258 to be set by applying a voltage signal to column conductor 264. Additionally, however, a photodiode 266 is connected across storage capacitor 258 so that it is reverse biased. Thus photo diode 266 is essentially non conducting in the dark and exhibits a small reverse conductance depending upon the degree of illumination. The physical structure of the pixel is arranged so that OLED 254 illuminates photodiode 266, thus providing an optical feedback path 252.

The photocurrent through photodiode 266 is approximately linearly proportional to the instantaneous light output level from OLED 254. Thus the charge stored on capacitor 258, and hence the voltage across the capacitor and the brightness of OLED 254, decays approximately exponentially over time. The integrated light output from OLED 254, that is the total number of photons emitted and hence the perceived brightness of the OLED pixel, is thus approximately determined by the initial voltage stored on capacitor 258.

The circuit of FIG. 2b solves the aforementioned problems associated with the linearity and variability of the driver transistor 256 and OLED 254 but exhibits some significant drawbacks in its practical implementation. The main drawback is that every pixel of the display needs refreshing every frame as storage capacitor 258 is discharged over no more than this period. Related to this, the circuit of FIG. 2b has a limited ability to compensate for ageing effects, again because the light pulse emitted from OLED 254 cannot extend beyond the frame period. Similarly, because the OLED is pulsed on and off it must be operated at an increased voltage for a given light output, which tends to reduce the circuit efficiency. Capacitor 258 also often exhibits non-linearities so that the stored charge is not necessarily linearly proportional to the voltage applied on column conductor 264. This results in non-linearities in the voltage-brightness relationship for the pixel as photodiode 266 passes a photocurrent (and hence charge) which is dependent upon the level of illumination it receives.

A further problem with the use of optical feedback is the risk of ambient light affecting the feedback response unless care is taken with the physical layout of the relevant components. Finally, all the prior art designs lack operational flexibility.

SUMMARY

There is therefore a need for improved display driver circuitry for organic LEDs which addresses the above problems.

According to a first aspect of the invention there is therefore provided display element driver circuitry for driving an element of an electro-optic display, the circuitry having first and second control lines and a data line, the circuitry comprising, a driver to drive the electro-optic display element in accordance with a drive voltage, a photosensitive-device optically coupled to the electro-optic display element to pass a current dependent upon illumination reaching the photosensitive device, a first control device coupled between the photosensitive device and the data line and responsive to a first control signal on the first control line to couple the photosensitive device to the data line; and a second control device coupled between the photosensitive device and the driver and responsive to a second control signal on the second control line to couple the photosensitive device to the driver.

This configuration provides the flexibility for the driver circuitry to be operated in a number of different modes according to the required function of the display, the ambient light conditions, and other factors. The operation of these different modes is described in more detail below and allows the driver circuitry, for example, to be operated in a first mode under bright illumination and a second mode under dimmer ambient light. Furthermore, because the photosensitive device can be substantially isolated from the driver the same circuitry can be used for both driving a pixel of an electro-optic display and for sensing or reading an image, for example to operate the display as a sensor for a scanner. In a similar way the photosensitive device can also be used to measure an ambient light level before the pixel with which it is associated is switched on so that the pixel brightness can be set to compensate for an ambient light level and, in particular, so that data written to the driver circuitry to set a pixel brightness can take account of the effect ambient light might have on the optical coupling between the electro-optic display element and the photosensitive device.

The input of the driver will generally have some associated input capacitance, but the circuit may further include an additional storage element coupled to the input of the driver and to the second control device to memorize a drive voltage for the display element. Preferably such a storage element comprises a capacitor which, for micro-displays, may be a digital capacitor. This capacitor may be integrated with the gate of a field effect transistor connected to the input of the driver. Preferably the first and second control devices each comprise a field effect transistor (FET) to provide a pair of controllable switches. This simplifies integration of the driver circuitry.

An active matrix display with a plurality of pixels may be constructed by providing each pixel with such display element driver circuitry. The data lines may be connected to column (or row) lines of the display and the control lines to row (or column) control circuitry. In a preferred embodiment each column (or row) line connected to the data lines is provided with a switch to allow the data lines to be connected either to a data line driver to drive a voltage or current on the data line or to measurement circuitry to read one or more illumination levels from the photosensitive devices associated with each pixel. Such measurement circuitry can also be used to check the correct operation of the photosensitive device, for example to ensure the leakage current is below a permitted threshold.

Preferably such an active matrix display also includes control circuitry to drive the first and second control lines to operate the display in a plurality of modes. One or more of these modes may be selected on installation of the device into a circuit, by effectively hard wiring the mode selection or the operating mode may be selected dynamically, for example according to prevailing operating conditions.

In one mode of operation the pixels of the display are controlled to measure an ambient light level before data is written to the display. Data may be written using the circuitry in either a current-controlled or voltage-controlled mode, in the latter case with or without optical feedback. Thus, for example, a current-controlled mode with an initial measurement cycle may be employed for bright ambient illumination and a voltage-controlled mode with optical feedback, along the lines described with reference to FIG. 2b, may be employed with or without a measurement cycle in dim ambient illumination conditions.

In conjunction with any of the above modes the driver circuitry for the pixels of the display may also be configured to use the photosensitive devices as an image sensor or scanner, for example once an appropriate drive voltage has been memorized by the storage element. This mode may also be used, for example, to provide a touch-sensitive display where the light pattern read from the display has sufficient resolution to detect a darkened area of the screen corresponding to a region of the display shielded from the ambient illumination by, for example, a finger tip. Alternatively, a stylus with a reflective tip may be employed and the photosensitive device of one pixel used to measure the light from neighboring pixels scattered by the tip. Deconvoluting this signal from the optical feedback signal may be achieved by, for example, monitoring the feedback (reflected light) from neighboring pixels to the pixel area concerned. Alternatively a significantly reduced voltage drive for a given requested photocurrent than in previous operation cycles may be used, due to an increased feedback to the photosensitive device.

In a related aspect the invention also provides a method of operating the above-described display element driver circuitry the method comprising controlling said circuitry to couple said photosensitive device to said data line, measuring a light level using said photosensitive device, controlling said circuitry to couple said driver to said data line; and driving said data line with a signal dependent upon said measuring.

Measuring the light level using the photosensitive device allows the control circuitry to drive the data line to compensate for the measured light level, and thus compensate for a background light level which may result from ambient illumination, or from other nearby emitting electro-optic display elements, or both. Preferably the method includes switching the display element off and optionally switching other nearby display elements off, before measuring the light level, for improved accuracy. This method may be employed before writing a light level signal to the display element in a selected one of the other operational modes of the circuitry.

In a first operational mode the display element driver circuitry is operated by controlling said first and second control lines to assert and de-assert said first and second control signals together; and driving said data line with a reference current to set a brightness for said display element when said driver, said photosensitive device and said data line are all coupled.

In a second operational mode the display element drive circuitry is operated by controlling said first and second control lines to assert and de-assert said first and second control signals together; and driving said data line with a reference voltage to set a brightness for said display element when said driver, said photosensitive device and said data line are all coupled.

In a third operational mode the display element driver circuitry is operated by controlling said second control line to assert said second control signal to couple the photosensitive device to the driver, controlling said first control line to couple the photosensitive device to the data line to select the display element, driving said data line with a reference voltage to set a brightness for said display element when said driver, said photosensitive device and said data line are all coupled; and controlling said first control line to decouple the photosensitive device from the data line to deselect the display element whilst maintaining said second control signal to maintain the coupling of said photosensitive device to said driver.

The invention also provides a method of operating an active matrix display as a light pattern or image sensor, the active matrix display comprising a plurality of display elements, each display element having associated display element driver circuitry, the method comprising, controlling the display element driver circuitry of a plurality of said display elements to couple the photosensitive device of each display element to the corresponding data line; and reading light pattern data from the display using the data line of each photosensitive device.

In further aspect the invention provides a method controlling the light output from a pixel of an active matrix electroluminescent display, the pixel including an electroluminescent display element and a light sensor optically coupled to the electroluminescent display element to provide an optical feedback path for controlling the electroluminescent display element light output, the method comprising, measuring an ambient light level using the light sensor; and writing a light level signal to the pixel modified to compensate for said ambient light level.

In all the above aspects of the invention the electro-optic or electroluminescent display element preferably comprises an organic light emitting diode.

BRIEF DESCRIPTION OF THE DRAWINGS

These and other aspects of the invention will now be further described, by way of example only, with reference to the accompanying figures in which.

DETAILED DESCRIPTION

Figure 3:
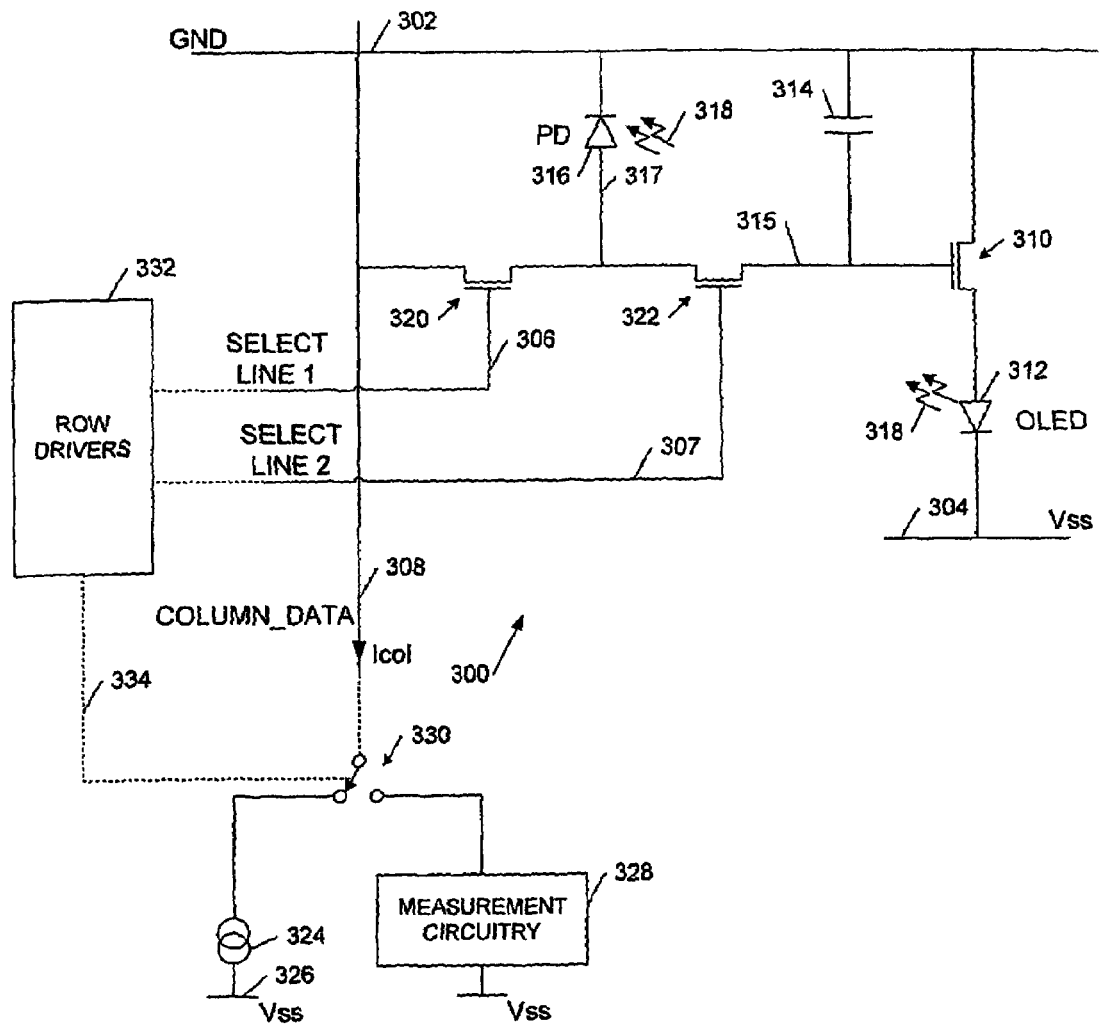
FIG. 3 shows an organic LED driver circuit according to an embodiment of the present invention.

Referring now to FIG. 3, this shows an organic LED driver circuit 300 which can be operated in a number of different modes. In an active matrix display typically each pixel is provided with such a driver circuit and further circuitry (not shown) is provided to address the pixels row-by-row, to set each row at the desired brightness. To power and control the driver circuitry and OLED display element the active matrix display is provided with a grid of electrodes including, as shown, a ground (GND) line 302, a power or $V_{ss}$ line 304, row select lines 306, 307 and a column data line 308.

In the illustrated embodiment column data line 308 is connected to a switch 330 to selectively couple the column data line either to a reference current source (or sink) 324 or to measurement circuitry 328. The reference current source (or sink) 324 is preferably a programmable constant current generator to allow a current in column data line 308 to be adjusted to a desired level to set a pixel brightness, as described in more detail below. In other embodiments, however, a programmable voltage generator may be used additionally or alternatively to current generator 324, to allow the driver circuit to be used in other modes. Measurement circuitry 328 allows the driver circuit to be used to measure an ambient light level when switch 330 connects column data line 308 to the measurement circuitry. Row driver circuitry 332 controls the first and second row select lines 306 and 307 according to the operating mode of driver circuitry 300.

The driver circuit 300 comprises a driver transistor 310 connected in series with an organic LED display element 312 between the GND 302 and $V_{ss}$ 304 lines. A storage capacitor 314, which may be integrated with the gate of transistor 310, stores a charge corresponding to a memorized gate voltage to control the drive current through OLED element 312.

Control circuitry for the driver comprises two switching transistors 320,322 with separate, independently controllable gate connections coupled to first and second select lines 306 and 307 respectively. A photodiode 316 is coupled to a node 317 between transistors 320 and 322. Transistor 320 provides a switched connection of node 317 to column data line 308. Transistor 322 provides a switched connection of node 317 to a node 315 to which is connected storage capacitor 314 and the gate of transistor 310. In the circuit of FIG. 3 all the transistors are PMOS.

Photodiode 316 is coupled between GND line 302 and line 317 so that it is reverse biased. The photodiode is physically arranged with respect to the OLED display element 312 such that an optical feedback path 318 exists between OLED 312 and photodiode 316. In other words, OLED 312 illuminates photodiode 316 and this allows an illumination-dependent current to flow in a reverse direction through photodiode 316, that is from GND line 302 towards $V_{ss}$. As the skilled person will understand, broadly speaking each photon generates an electron within photodiode 316 which can contribute to a photocurrent.

When first select line 306 is active transistor 320 is on, that is the switch is "closed" and there is a relatively low impedance connection between column data line 308 and node 317. When first select line 306 is inactive transistor 320 is switched off and photodiode 316 is effectively isolated from column data line 308. When second select line 307 is active transistor 322 is switched on and nodes 315 and 317 are coupled; when second select line 307 is inactive transistor 322 is switched off and node 315 is effectively isolated from node 317.

It can be seen that when both transistors 320 and 322 are switched off (i.e. both the first and second select lines 306 and 307 are inactive) photodiode 316 is effectively isolated from the remainder of the driver circuitry. Similarly when transistor 322 is off (second select line 307 is inactive) and transistor 320 is on (first select line 306 is active) photodiode 316 is effectively connected between ground (GND) line 302 and column data line 308. In this way photodiode 316 may be effectively isolated from the remainder of the driver circuitry and, when switch 330 connects column data line 308 to measurement circuitry 328, photodiode 316 may be used as a sensor to measure the local ambient light level. This ambient light level may result from the ambient light conditions in the local display environment or from light emitted from OLED 312 or the corresponding OLEDs in neighboring pixels. Alternatively the photodiodes of a plurality of pixels may be used to read an image pattern using a display.

The driver circuitry 300 may be operated in a current-controlled mode with optical feedback, in a voltage-controlled mode with optical feedback, and in a voltage-controlled mode without optical feedback. Any or all of these modes may be employed with a light measurement mode to make an ambient light measurement before data is written to a pixel, or to input an image after data is written to a pixel.

In a first mode of operation first and second select lines 306 and 307 are connected together or driven in tandem by row drivers 332 so that the circuit operates as a current-controlled driver with optical feedback. When the switch 330 is in the position shown in FIG. 3 the programmable reference current generator 324 attempts to cause a reference current which will be referred to as $I_{col}$ to flow to off-pixel $V_{ss}$ connection 326. In this mode line 317 may be referred to as a current sense line, passing a current $I_{sense}$ and line 315 may be referred to as a control line, passing a current $I_{error}$ to set a voltage on capacitor 314 to control OLED 312. When first and second (row)select lines 306 and 307 are active transistors 320 and 322 are on and $I_{col}=I_{sense}+I_{error}$ and thus the current $I_{error}$ flows either onto or off capacitor 314 until OLED 312 illuminates photodiode 316 such that $I_{sense}=I_{col}$. At this point the first and second row select lines 306 and 307 can be deactivated and the voltage required for this level of brightness is memorized by capacitor 314.

The time required for the voltage on capacitor 314 to stabilize depends upon a number of factors, which may be varied in accordance with the desired device characteristics, and may be a few microseconds. Broadly speaking a typical OLED drive current is of the order of 1 μA whilst a typical photocurrent is around 0.1% of this, or of the order of 1 nA (in part dependent upon the photodiode area). It can therefore be seen that the power handling requirements of transistors 320 and 322 are negligible compared with that of the drive transistor 310, which must be relatively large. To speed up the settling time of the circuit it is preferable to use a relatively small value for capacitor 314 and a relatively large area photodiode to increase the photocurrent. This also helps reduce the risk of noise and stability at very low brightness levels associated with stray or parasitic capacitance on column data line 308.

Figure 1A:
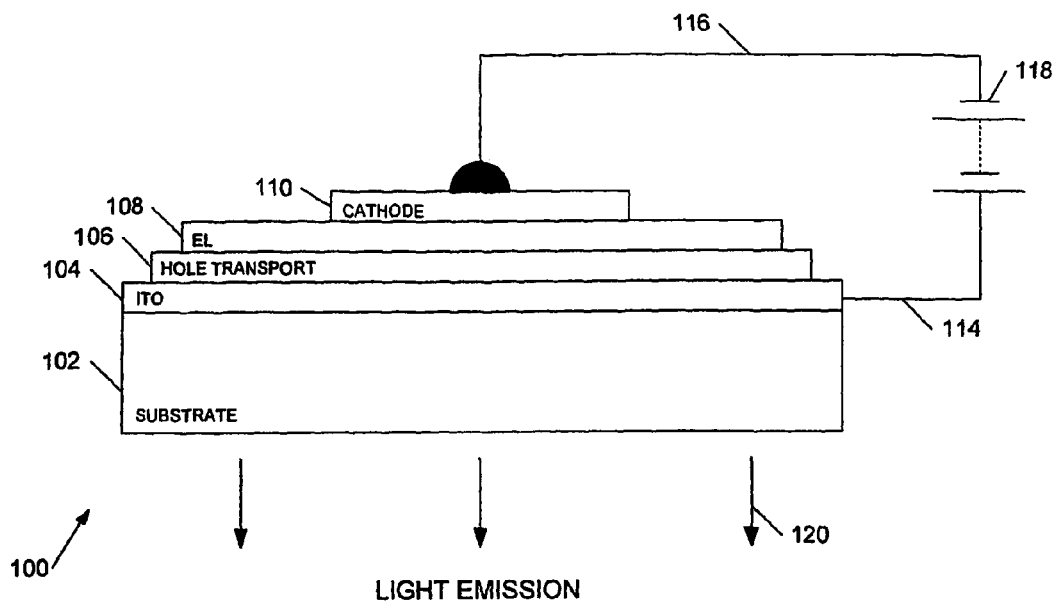
FIGS. 1a and 1b show, respectively, a basic organic LED structure, and a typical voltage-controlled OLED driver circuit.
Figure 1B:
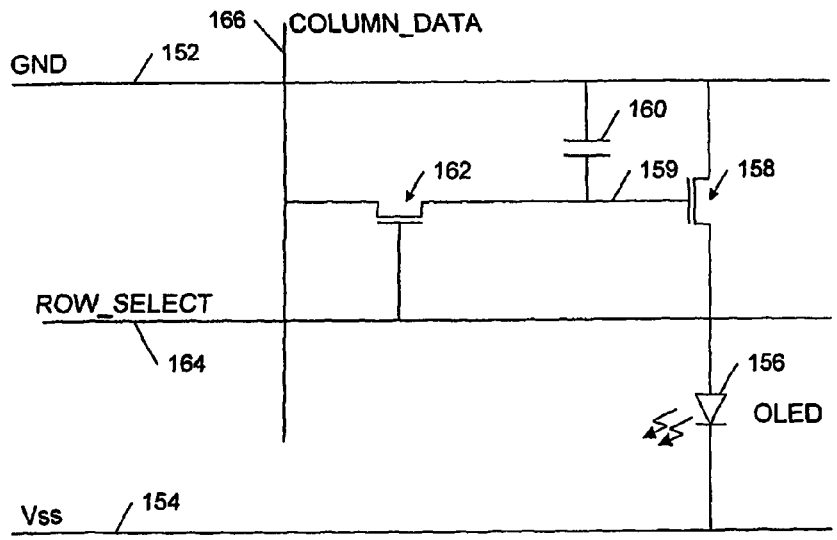

In a second mode the driver circuitry 300 is voltage controlled and operates in a similar manner to the prior art circuit of FIG. 1*b*, that is without optical feedback. As in the first mode of operation, the first and second select lines are connected together or driven in tandem by row drivers 332 but instead of column data line 308 being driven by a reference current generator 324, line 308 is driven by a voltage reference source, programmable to adjust the pixel brightness. The voltage source preferably has a low internal resistance to approximate a constant voltage source.

In this second mode of operation when the first and second select lines 306 and 307 are active capacitor 314 is coupled to column data line 308 and is therefore charged to the voltage output by the reference voltage generator. The small reverse current through photodiode 316 due to illumination by OLED 312 has a substantially no effect on the voltage on line 308 because of the low internal resistance of the voltage source. Once capacitor 314 has been charged to the required voltage transistors 320 and 322 are switched off by deasserting the first and second select lines 306 and 307, so that capacitor 314 does not discharge through photodiode 316. In this mode of operation the pair of transistors 320 and 322 effectively perform the same function as transistor 162 in the circuit of FIG. 1*b*.

Figure 2A:
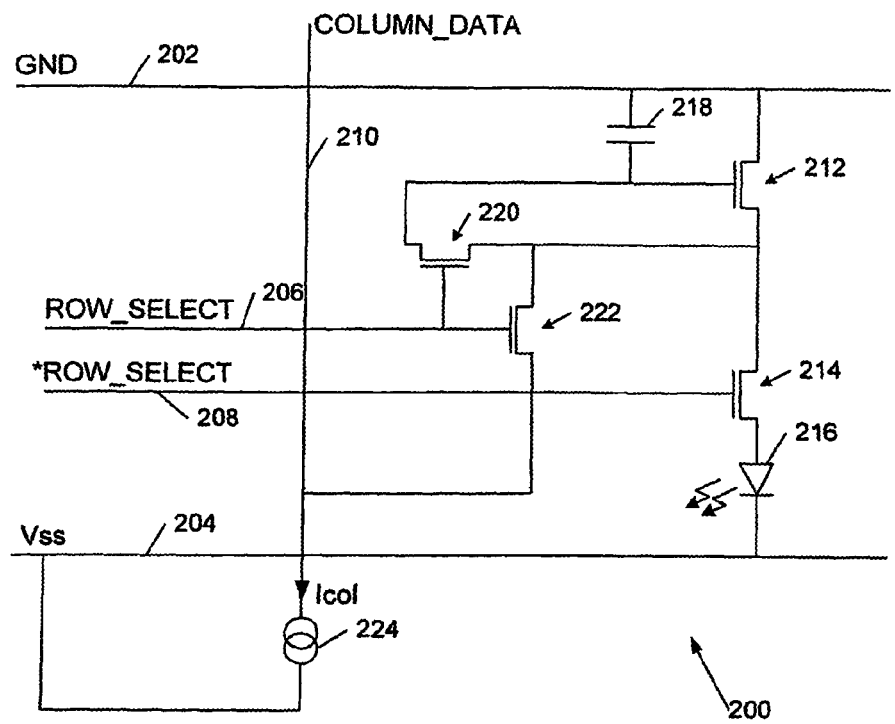
FIGS. 2a and 2b show, respectively, a current-controlled OLED driver circuit, and a voltage-controlled OLED driver circuit with optical feedback according to the prior art.
Figure 2B:
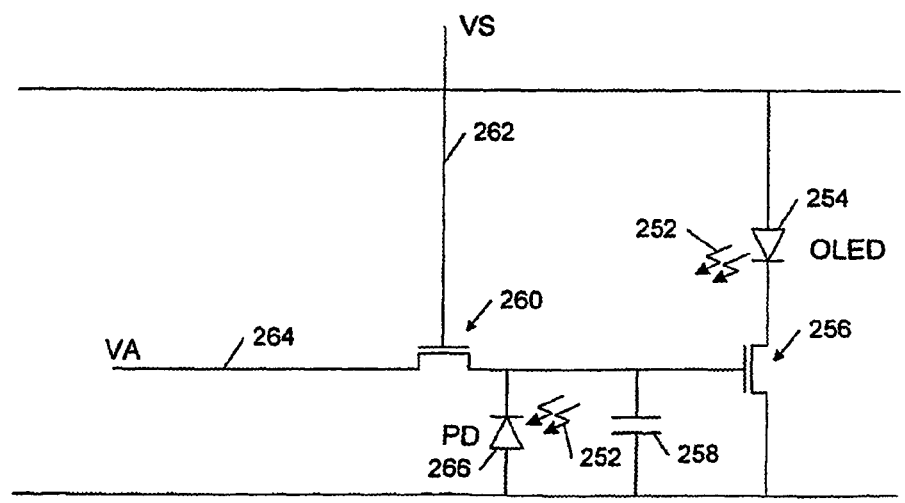

In a third mode of operation the circuit is again driven by a programmable reference voltage source but the second select line is controlled so that it is always active (and hence so that transistor 322 is always on) whilst OLED 312 is on. In this way photodiode 316 is connected across storage capacitor 314 so that the circuit operates in substantially the same way as the circuit of FIG. 2*b* described above, transistor 320 performing the function of transistor 260 in FIG. 2*b*. In a simple embodiment the second select line 307 may simply be tied to a fixed voltage supply to ensure this line is always active. However transistor 322 need only be on long enough to ensure that capacitor 314 has enough time to discharge and thus it is still possible in this mode to switch off transistor 322 at times to allow photodiode 316 to be connected between lines 302 and 308 by transistor 320 and used as a sensor.

In an improvement of this mode of operation the programmable reference voltage source can be arranged to deliver a predetermined charge to capacitor 314 since, when photodiode 316 is connected across capacitor 314, it is the charge on capacitor 314 which determines the apparent brightness of OLED 312 rather than the voltage itself. Delivering a predetermined charge to capacitor 314, rather than charging the capacitor to a reference voltage, reduces the effect of non-linearities in the charge-voltage characteristic of capacitor.

In a preferred mode of operation the driver circuitry 300 is controlled to provide a measurement cycle before pixel illumination data is written to the circuit to set the brightness of OLED 312. To achieve this row driver circuitry 332 preferably controls the first and second select lines 306 and 307, and switch 330 by means of a control line 334, to switch transistor 322 off and transistor 320 on, to connect photodiode 316 to measurement circuitry 328. Measurement circuitry 328 can then measure the ambient light level in the vicinity of photodiode 316 and, optionally, can also perform additional tasks such as checking the proper functioning of the photodiode, for example by checking its leakage current.

The measurement circuitry can be arranged to measure a photocurrent through photodiode 316, or a photovoltaic mode of operation of the photodiode may be employed when the photodiode is brightly illuminated, the photodiode operating as a photocell and measurement circuitry 328 measuring a voltage. The light level measurement may be used to determine the degree of illumination of OLED 312 or of the OLEDs of adjacent pixels or, for example, to characterize the drive circuit or OLED 312. In particular, however, the light level measured by photodiode 316 may be used to compensate for any disturbances to the operation of the above-described modes with optical feedback, for example by writing a modified reference current or voltage to the pixel to take account of the ambient light level.

In a preferred embodiment, therefore, OLED 312 is switched off before a measurement is made using photodiode 316. In the third mode of operation described above OLED 312 will automatically be switched off after no more than one frame period, but in the first and second modes of operation the OLED may be switched off by writing a dark level signal to the pixel.

In the above described modes it will be recognized that the first select line 306 in effect operates as a row select line whilst the second select line 307 operates as a combined mode and row select line. Thus in order to perform a (write black)-(measure)-(write level) cycle for a selected row the first select line 306 is held active whilst the second select line 307 is toggled from active during a write cycle to inactive or deasserted during a measure cycle.

Figure 4A:
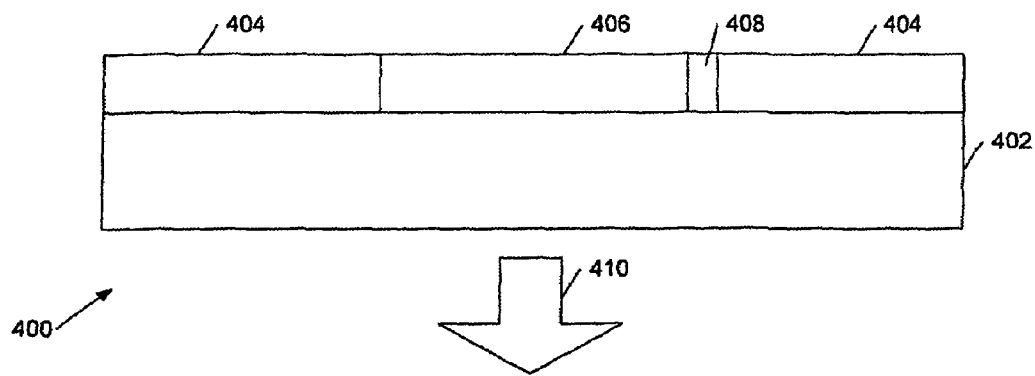
FIGS. 4a and 4b show vertical cross sections through device structures of OLED display elements with driver circuits incorporating optical feedback.
Figure 4B:
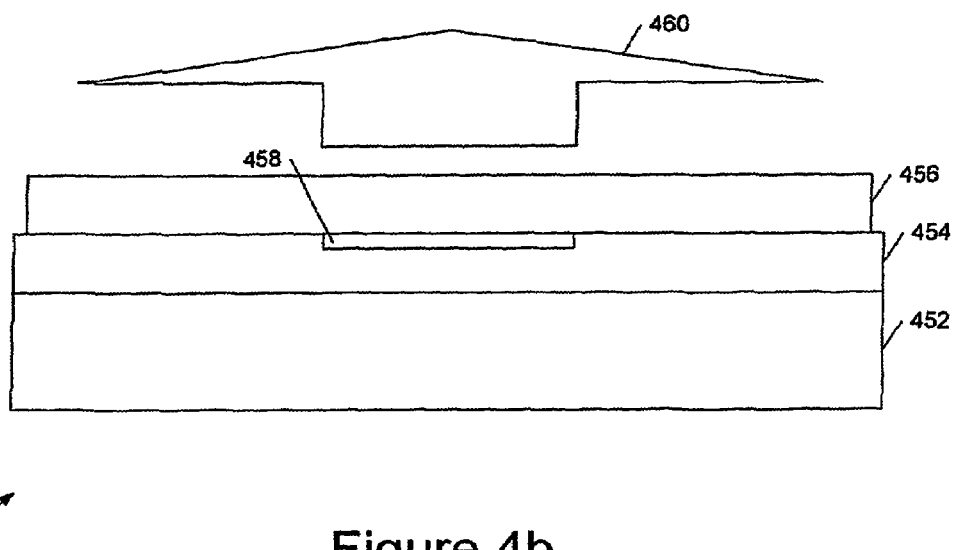

Referring now to FIG. 4, this shows, in outline, two alternative physical structures for OLED pixel driver circuits incorporating optical feedback (the drawings are not to scale). FIG. 4*a* shows a bottom-emitting structure 400 and FIG. 4*b* shows a top-emitter 450.

In FIG. 4*a* an OLED structure 406 is deposited side-by-side with polysilicon driver circuitry 404 on a glass substrate 402. The driver circuitry 404 incorporates a photodiode 408 to one side of the OLED structure 406. Light 410 is emitted through the bottom (anode) of the substrate.

FIG. 4*b* shows a cross section through an alternative structure 450 which emits light 460 from its top (cathode) surface. A glass substrate 452 supports a first layer 454 comprising the driver circuitry and including a photodiode 458. An OLED pixel structure 456 is then deposited over the driver circuitry 454. A passivation or stop layer may be included between layers 454 and 456. Where the driver circuitry is fabricated using (crystalline) silicon rather than polysilicon or amorphous silicon a structure of the type shown in FIG. 4*b* is required and substrate 452 is a silicon substrate.

In the structures of FIGS. 4*a* and 4*b* the pixel driver circuitry may be fabricated by conventional means. The organic LEDs may be fabricated using either ink jet deposition techniques such as those described in EP 880303 to deposit polymer-based materials or evaporative deposition techniques to deposit small molecule materials. Thus, for example, so-called micro-displays with a structure of the type illustrated in FIG. 4*b* may be fabricated by ink jet printing OLED materials onto a conventional silicon substrate on which CMOS pixel driver circuitry has previously been fabricated.

The illustrated embodiment of the driver circuit uses PMOS transistors but the circuits may be inverted and NMOS may be employed or, alternatively, a combination of PMOS and NMOS transistors may be used. The transistors may comprise thin film transistors (TFTs) fabricated from amorphous or poly-silicon on a glass or plastic substrate or conventional CMOS circuitry may be used. In other embodiments plastic transistors such as those described in WO 99/54936 may be employed, and the photodiode may comprise a reverse biased OLED to allow the entire circuitry to be fabricated from plastic. Similarly although the circuit has been described with reference to field effect transistors, bipolar transistors may also be used.

The display element driver circuitry has been described with reference to its use for driving organic LEDs but the circuitry may also be employed with other types of electroluminescent display such as inorganic TFEL (Thin Film Electroluminescent) displays, gallium arsenide on silicon displays, porous silicon displays, photoluminescence quenching displays as described in UK patent application no. 0121077.2, and the like. Although the driver circuitry primarily finds applications in active matrix displays it may also be used with other types of display such as segmented displays and hybrid semi-active displays.

The preferred photosensor is a photodiode which may comprise a PN diode in TFT technology or a PIN diode in crystalline silicon. However other photosensitive devices such as photoresistors and photosensitive bipolar transistors and FETs may also be employed, providing they have a characteristic in which a photocurrent is dependent upon their level of illumination.

No doubt many other effective alternatives will occur to the skilled person and it should be understood that the invention is not limited to the described embodiments.

The invention claimed is:

1. Display element driver circuitry for driving an element of an electro-optic display, the circuitry having first and second control lines and a data line, the circuitry comprising:
   a driver to drive the electro-optic display element in accordance with a drive voltage;
   a photosensitive device optically coupled to the electro-optic display element to pass a current dependent upon illumination reaching the photosensitive device;
   a first control device coupled between the photosensitive device and the data line and responsive to a first control signal on the first control line to couple the photosensitive device to the data line; and
   a second control device coupled to provide a switchable current path between the photosensitive device and the driver and responsive to a second control signal on the second control line to couple the photosensitive device to the driver to provide a current path therebetween.

2. Display element driver circuitry as claimed in claim 1, further comprising a storage element coupled to the second control device and to said driver to memorize a drive voltage for the driver; and wherein said second control device is coupled between said storage element and said photosensitive device.

3. Display element driver circuitry as claimed in claim 2, wherein the storage element comprises a capacitor.

4. Display element driver circuitry as claimed in claim 3, wherein the driver comprises a field effect transistor (FET) and the capacitor comprises a gate capacitance of said FET.

5. Display element driver circuitry as claimed in claim 1, wherein said first and second control devices each comprise a FET switch and wherein each of said first and second control lines is coupled to a respective gate connection of said FET switch.

6. An active matrix display comprising a plurality of electro-optic display elements, each display element having associated display element driver circuitry as claimed in claim 1.

7. An active matrix display as claimed in claim 6, further comprising a switch to selectively couple said data line to a data line driver and to a signal sense circuit.

8. An active matrix display as claimed in claim 6, further comprising control circuitry to drive said first and second control lines to operate the display in a plurality of modes.

9. An active matrix display as claimed in claim 8, wherein said modes include an ambient light compensate mode in which said control circuitry controls the display element driver circuitry to measure an ambient light level before writing data to the display.

10. An active matrix display as claimed in claim 8, wherein said modes include a current driver mode in which the brightness of a said display element is set by a reference current on said data line.

11. An active matrix display as claimed in claim 8, wherein said modes include a first voltage drive mode in which the brightness of a said display element is set by a voltage on said data line.

12. An active matrix display as claimed in claim 8, wherein said modes include a second voltage drive mode in which the brightness of a said display element is set by a voltage on said data line and in which said second control line is driven to couple said photosensitive element and said driver whilst said display element is on.

13. An active matrix display as claimed in claim 8, further comprising a pattern sense input mode in which said control circuitry controls the display element driver circuitry to input a light pattern from said display using a plurality of said photosensitive devices associated with a corresponding plurality of said display elements.

14. An active matrix display as claimed in claim 6, wherein said electro-optic display element comprises an organic light emitting diode.

15. Display element driver circuitry as claimed in claim 1, wherein said electro-optic display element comprises an organic light emitting diode.

16. A method of operating display element driver circuitry as claimed in claim 1, the method comprising:
   controlling said circuitry to couple said photosensitive device to said data line;
   measuring a light level using said photosensitive device;
   controlling said circuitry to couple said driver to said data line; and
   driving said data line with a signal dependent upon said measuring.

17. A method as claimed in claim 16, further comprising writing an initial dark level signal to the display element or pixel prior to said measuring.

18. A method of operating display element driver circuitry as claimed in claim 1, the method comprising:
   controlling said first and second control lines to assert and de-assert said first and second control signals together; and
   driving said data line with a reference current to set a brightness for said display element when said driver, said photosensitive device and said data line are all coupled.

19. A method as claimed in claim 18, further comprising:
   controlling said circuitry to couple said photosensitive device to said data line;
   measuring a light level using said photosensitive device; and
   controlling said circuitry to couple said driver to said data line; and
   wherein said driving drives said data line with a signal dependent upon said measuring.

20. A method as claimed in claim 19, further comprising writing an initial dark level signal to the display element or pixel prior to said measuring.

21. A method of operating display element driver circuitry as claimed in claim 1, the method comprising:
 controlling said first and second control lines to assert and de-assert said first and second control signals together; and
 driving said data line with a reference voltage to set a brightness for said display element when said driver, said photosensitive device and said data line are all coupled.

22. A method as claimed in claim 21, further comprising:
 controlling said circuitry to couple said photosensitive device to said data line;
 measuring a light level using said photosensitive device; and
 controlling said circuitry to couple said driver to said data line; and
 wherein said driving drives said data line with a signal dependent upon said measuring.

23. A method of operating display element driver circuitry as claimed in claim 1, the method comprising:
 controlling said second control line to assert said second control signal to couple the photosensitive device to the driver;
 controlling said first control line to couple the photosensitive device to the data line to select the display element;
 driving said data line with a reference voltage to set a brightness for said display element when said driver, said photosensitive device and said data line are all coupled; and
 controlling said first control line to decouple the photosensitive device from the data line to deselect the display element whilst maintaining said second control signal to maintain the coupling of said photosensitive device to said driver.

24. A method of operating an active matrix display as a light pattern sensor, the active matrix display comprising a plurality of display elements, each display element having associated display element driver circuitry as claimed in claim 1, the method comprising:
 controlling the display element driver circuitry of a plurality of said display elements to couple the photosensitive device of each display element to the corresponding data line; and
 reading light pattern data from the display using the data line of each photosensitive device.

* * * * *